US012772776B2

(12) United States Patent
Wong

(10) Patent No.: US 12,772,776 B2
(45) Date of Patent: *Oct. 20, 2026

(54) DRYING SYSTEM WITH INTEGRATED SUBSTRATE ALIGNMENT STAGE

(71) Applicant: Applied Materials, Inc., Santa Clara, CA (US)

(72) Inventor: Justin Ho Kuen Wong, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 910 days.

This patent is subject to a terminal disclaimer.

(21) Appl. No.: 17/681,671

(22) Filed: Feb. 25, 2022

(65) Prior Publication Data

US 2022/0282918 A1 Sep. 8, 2022

Related U.S. Application Data

(60) Provisional application No. 63/156,298, filed on Mar. 3, 2021.

(51) Int. Cl.
*H10P 72/00* (2026.01)
*B08B 3/10* (2006.01)
(Continued)

(52) U.S. Cl.
CPC ............ *H10P 72/0416* (2026.01); *B08B 3/10* (2013.01); *F26B 3/04* (2013.01); *F26B 11/18* (2013.01);
(Continued)

(58) Field of Classification Search
CPC ......... H01L 21/67057; H01L 21/67259; H01L 21/68; H01L 21/68707; H01L 21/67028;
(Continued)

(56) References Cited

U.S. PATENT DOCUMENTS

| | | | |
|---|---|---|---|
| 6,413,145 | B1 | 7/2002 | Pinson et al. |
| 6,500,051 | B1 | 12/2002 | Nishi et al. |

(Continued)

FOREIGN PATENT DOCUMENTS

| | | | |
|---|---|---|---|
| KR | 10-2009-0037529 | | 4/2009 |
| KR | 20090037529 | * | 4/2009 |
| WO | WO 2020/078190 | | 4/2020 |

OTHER PUBLICATIONS

International Search Report and Written Opinion in International Appln. No. PCT/US2022/017892, mailed Jun. 10, 2022, 10 pages.

*Primary Examiner* — John P Mccormack
(74) *Attorney, Agent, or Firm* — Fish & Richardson P.C.

(57) ABSTRACT

A substrate cleaning and drying system includes a cleaning station, a drying station positioned adjacent the cleaning station, a cleaner robot to transfer a substrate from the cleaning station to the drying station, an aligner stage adjacent to the drying station, a robot arm rotatable between a substantially vertical first position for receiving the substrate from the drying station and a substantially horizontal second position for releasing the substrate onto the aligner stage, and a factory interface robot to transfer a substrate from the aligner stage into a factory interface module while in a horizontal orientation. The aligner stage includes a rotatable support to hold the substrate in a substantially horizontal orientation and to rotate the substrate to a desired orientation.

17 Claims, 5 Drawing Sheets

(51) Int. Cl.

| | |
|---|---|
| ***F26B 3/04*** | (2006.01) |
| ***F26B 11/18*** | (2006.01) |
| ***F26B 25/00*** | (2006.01) |
| ***H10P 72/50*** | (2026.01) |
| ***H10P 72/76*** | (2026.01) |

(52) U.S. Cl.
CPC ........ *F26B 25/003* (2013.01); *H10P 72/0606* (2026.01); *H10P 72/50* (2026.01); *H10P 72/7602* (2026.01)

(58) Field of Classification Search
CPC ......... H01L 21/67051; H01L 21/67718; H01L 21/67751; H01L 21/67034; H01L 21/02057; H01L 21/67219; H01L 21/67294; H01L 21/67742; B08B 3/10; F26B 3/04; F26B 11/18; F26B 25/003
USPC ............................................................ 34/282
See application file for complete search history.

(56) References Cited

U.S. PATENT DOCUMENTS

| | | | | |
|---|---|---|---|---|
| 6,726,848 | B2 | 4/2004 | Hansen et al. | |
| 6,818,066 | B2 | 11/2004 | Cheung | |
| 2002/0121290 | A1 | 9/2002 | Tang et al. | |
| 2006/0219275 | A1 | 10/2006 | Martin et al. | |
| 2006/0254715 | A1 | 11/2006 | Yudiivsky et al. | |
| 2006/0260653 | A1 | 11/2006 | Fishkin et al. | |
| 2007/0111519 | A1* | 5/2007 | Lubomirsky ..... | H01L 21/02068 257/E21.174 |
| 2007/0272278 | A1 | 11/2007 | Fishkin et al. | |
| 2008/0093022 | A1 | 4/2008 | Yilmaz et al. | |
| 2008/0166208 | A1* | 7/2008 | Lester ............... | H01L 21/68707 414/217 |
| 2009/0044843 | A1 | 2/2009 | Shirazi | |
| 2010/0041316 | A1 | 2/2010 | Wang et al. | |
| 2010/0171823 | A1 | 7/2010 | Yamamoto et al. | |
| 2010/0320090 | A1 | 12/2010 | Yoshioka et al. | |
| 2011/0220153 | A1* | 9/2011 | Tanaka .............. | H01L 21/67057 134/61 |
| 2012/0305033 | A1 | 12/2012 | Keigler et al. | |
| 2013/0130593 | A1 | 5/2013 | Kalenian et al. | |
| 2014/0202921 | A1 | 7/2014 | Babbs et al. | |
| 2014/0209239 | A1 | 7/2014 | Ko et al. | |
| 2014/0271085 | A1 | 9/2014 | Gajendra | |
| 2016/0181086 | A1* | 6/2016 | Mikhaylichenko .......................... | H01L 21/67733 134/30 |
| 2017/0236739 | A1 | 8/2017 | Moura et al. | |
| 2017/0320188 | A1 | 11/2017 | Kweon et al. | |
| 2019/0304826 | A1* | 10/2019 | Liu .................... | G01N 21/9505 |
| 2020/0144084 | A1* | 5/2020 | Ikeda ................ | H01L 21/68707 |
| 2020/0176279 | A1 | 6/2020 | Velazquez et al. | |
| 2021/0398834 | A1 | 12/2021 | Shen et al. | |
| 2022/0285175 | A1 | 9/2022 | Wong | |

* cited by examiner

DRYING SYSTEM WITH INTEGRATED SUBSTRATE ALIGNMENT STAGE

CROSS-REFERENCE TO RELATED APPLICATIONS

This application claims the benefit of priority to U.S. Provisional Application No. 63/156,298, filed on Mar. 3, 2021, the contents of which are hereby incorporated by reference.

TECHNICAL FIELD

This disclosure relates to methods and systems for drying and aligning substrates.

BACKGROUND

An integrated circuit is typically formed on a substrate (e.g., a semiconductor wafer) by the sequential deposition of conductive, semiconductive, or insulative layers, and by the subsequent processing of the layers.

Chemical mechanical polishing (CMP) is a process for planarization of substrate surfaces used in integrated circuit fabrication. Generally, CMP is performed by providing relative motion between a substrate pressed against a polishing surface.

Following polishing, a substrate has to be cleaned and dried to effectively remove contaminants from the substrate's surface. These contaminants may include abrasive particles from the polishing slurry, material removed from the substrate due to polishing, particles abraded from the polishing pad, or other particulate or chemical contamination. Desirable cleaning levels can be achieved by using one or more of aqueous cleaning in a tank of cleaning fluid, a buffing brush, a buffing pad, or a rinsing bath. Drying of a wet substrate can be performed using spin-dry or by Marangoni drying. Following post-CMP cleaning and drying, the substrate is offloaded by a factory interface robot. Measurements of the substrate, e.g., to detect thickness variations across the substrate, can be performed by an in-line system in the factory interface module or with a stand-alone metrology system after offloading of the substrate from the cleaner.

SUMMARY

In one aspect, a substrate cleaning and drying system includes a cleaning station including a first support to hold a substrate in a substantially vertical orientation, a drying station positioned adjacent the cleaning station, a cleaner robot to transfer a substrate from the cleaning station to the drying station, an aligner stage adjacent to the drying station, a robot arm rotatable between a substantially vertical first position for receiving the substrate from the drying station and a substantially horizontal second position for releasing the substrate onto the aligner stage, a factory interface module to support a cassette to hold a plurality of substrates, and a factory interface robot to transfer a substrate from the aligner stage into the factory interface module while in a horizontal orientation. The drying station includes a tank to contain a liquid, a second support to hold the substrate in a generally vertical orientation in the liquid, and a dispenser to deliver drying fluid comprising a surfactant. The aligner stage includes a rotatable support to hold the substrate in a substantially horizontal orientation and to rotate the substrate about an axis substantially perpendicular to the substrate to a desired orientation.

In another aspect, a substrate drying system for use in a CMP cleaner include a drying station having a drier, an aligner stage adjacent to the drying station, and a robot arm movable between a first position above the drier and a second position for releasing substrates onto the rotatable support of the aligner stage with the substrate in a generally horizontal orientation. The aligner stage includes a rotatable support to hold a substrate in a substantially horizontal position and to rotate the substrate to a desired orientation.

In another aspect, a method of operating a drying system includes drying a first wafer with a vertical drying process, tilting the dried first wafer to a horizontal orientation, and aligning the first wafer about a vertical axis while simultaneously drying a second wafer with the vertical drying process.

Certain implementations may include, but are not limited to, one or more of the following possible advantages. The drying and aligning of substrates can be performed more efficiently, improving throughput. Reducing the total number of robot moves required to dry and align the substrate allows the robot to maintain its steady state cycle and streamlines the process. The reduction in average processing time can lower the cost per substrate. The substrates can be aligned and inserted into an in-line metrology system or into a substrate cassette in a desired orientation.

The details of one or more implementations are set forth in the accompanying drawings and the description. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Following chemical mechanical polishing, a substrate needs to be cleaned and dried in order to remove debris and contaminants. Following this process, the substrate is picked up by the factory interface robot. The factory interface robot then places the substrate into an in-line metrology station or into a substrate cassette. However, the substrate must typically be in a predetermined orientation, i.e., "aligned," when inserted into the in-line metrology station or substrate cassette. Although the factory interface robot typically has sufficient degrees of freedom to rotate the substrate for the required alignment, these steps take time during which the factory interface robot is unable to perform other functions, e.g., transporting another substrate from a cassette to the polishing system. As such, time required by the factory interface robot to align the substrate can decrease throughput and increase processing time.

An approach that may address one or more of these issues is to incorporate an alignment system as part of the post- CMP drying process, and to interface the alignment system with the factory interface robot.

Figure 1:
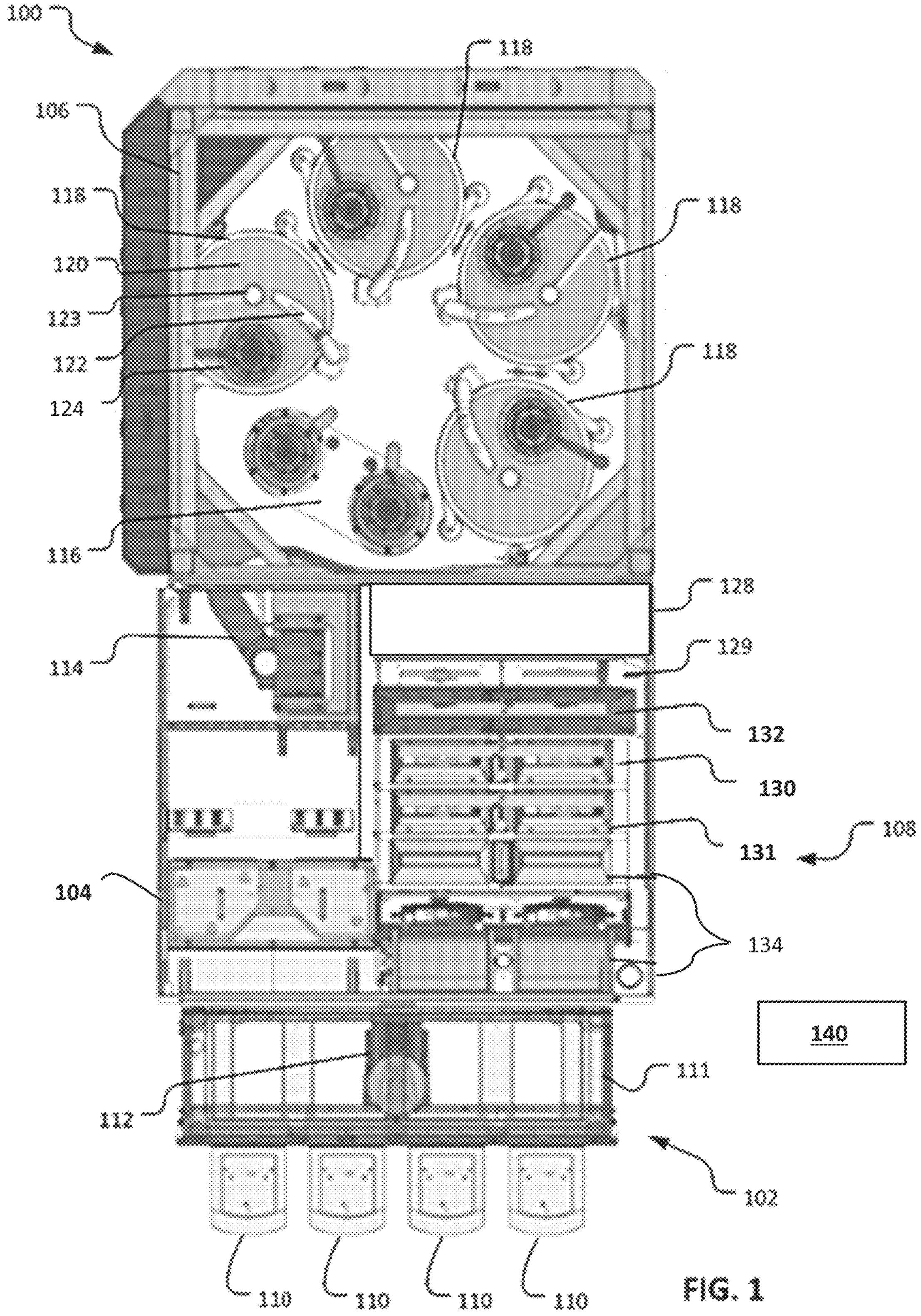
FIG. 1 is a schematic top view of a chemical mechanical polishing system.

FIG. 1 illustrates an interior view of a chemical mechanical polishing (CMP) system 100. The system 100 generally includes a factory interface 102, an input pass through station 104, a polisher 106, and a cleaner 108 that has a drying station 134 with a drier e.g., a Marangoni drier, to dry substrates that have been cleaned. The four major components are generally disposed within the CMP system 100.

The factory interface 102 includes a support to hold a plurality of substrate cassettes 110, a housing 111 that encloses a chamber, and one or more factory interface robots 112. The factory interface robot 112 generally provides the range of motion required to transfer substrates between the cassettes 110 and other modules of the system 100, e.g., from the cassettes 110 to the input station 104 and from the drying station 134 of the cleaner 108 back to the cassettes 110.

Unprocessed substrates are generally transferred from the cassettes 110 to the input station 104 by the factory interface robot 112. The input station 104 generally facilitates transfer of the substrate between the factory interface robot 112 and the transfer robot 114. The transfer robot 114 transfers the substrate between the input station 104 and the polisher 106.

The polisher 106 generally includes a transfer station 116 and one or more polishing stations 118. The transfer station 116 is configured to receive the substrate from the transfer robot 114, and to transfer the substrate to a carrier head 124 that retains the substrate during polishing. Following a polishing operation performed on a substrate, the carrier head 124 will transfer the substrate back to the transfer station 116.

Each polishing station 118 includes a rotatable disk-shaped platen on which a polishing pad 120 is situated. The platen is operable to rotate about an axis. The polishing pad 120 can be a two-layer polishing pad with an outer polishing layer and a softer backing layer. The polishing stations 118 further includes a dispensing arm 122, to dispense a polishing liquid, e.g., an abrasive slurry, onto the polishing pad 120. In the abrasive slurry, the abrasive particles can be silicon oxide, but for some polishing processes use cerium oxide abrasive particles. The polishing station 118 can also include a conditioner head 123 to maintain the polishing pad 120 at a consistent surface roughness.

The transfer robot 114 then removes the substrate from the polisher 106. In some implementations, the transfer robot 114 removes the substrate in a horizontal orientation from the polisher 106 and reorients the substrate vertically to be placed in the cleaner 108.

The cleaner 108 generally includes one or more cleaning stations that can operate independently or in concert. For example, the cleaner 108 can include one or more brush or buffing pad cleaners 130, 131 and a megasonic cleaner 132. Briefly, a pad cleaner 130 includes a chamber in which a substrate can be placed and rotating brushes or spinning buffing pads contact the surface of the substrate to remove any remaining particulates. In the megasonic cleaner 132 high frequency vibrations produce controlled cavitation in a cleaning liquid to clean the substrate. After cleaning, the substrates are transferred into the drier in the drying station 134. The drying station 134 can also serve as a rinsing and drying station, e.g., to rinse the substrate in a rinsing liquid and then dry the substrate as the substrate is being removed from the rinsing liquid.

In some implementations, at least two of the cleaning stations are configured to hold the substrate in a substantially vertical orientation, e.g., up to 15° off vertical axis, during the cleaning process. The substrate can be transferred in the substantially vertical orientation between the cleaning stations and the drying station by a cleaner robot arm 128 suspended from and movable along a track 129. A controller 140 can cause the robot arm 128 to hold and walk each substrate from one station to the next along the track. The drying station 134 can be positioned adjacent to the cleaner station 131 of the cleaner 108 at the end of the track.

Figure 2:
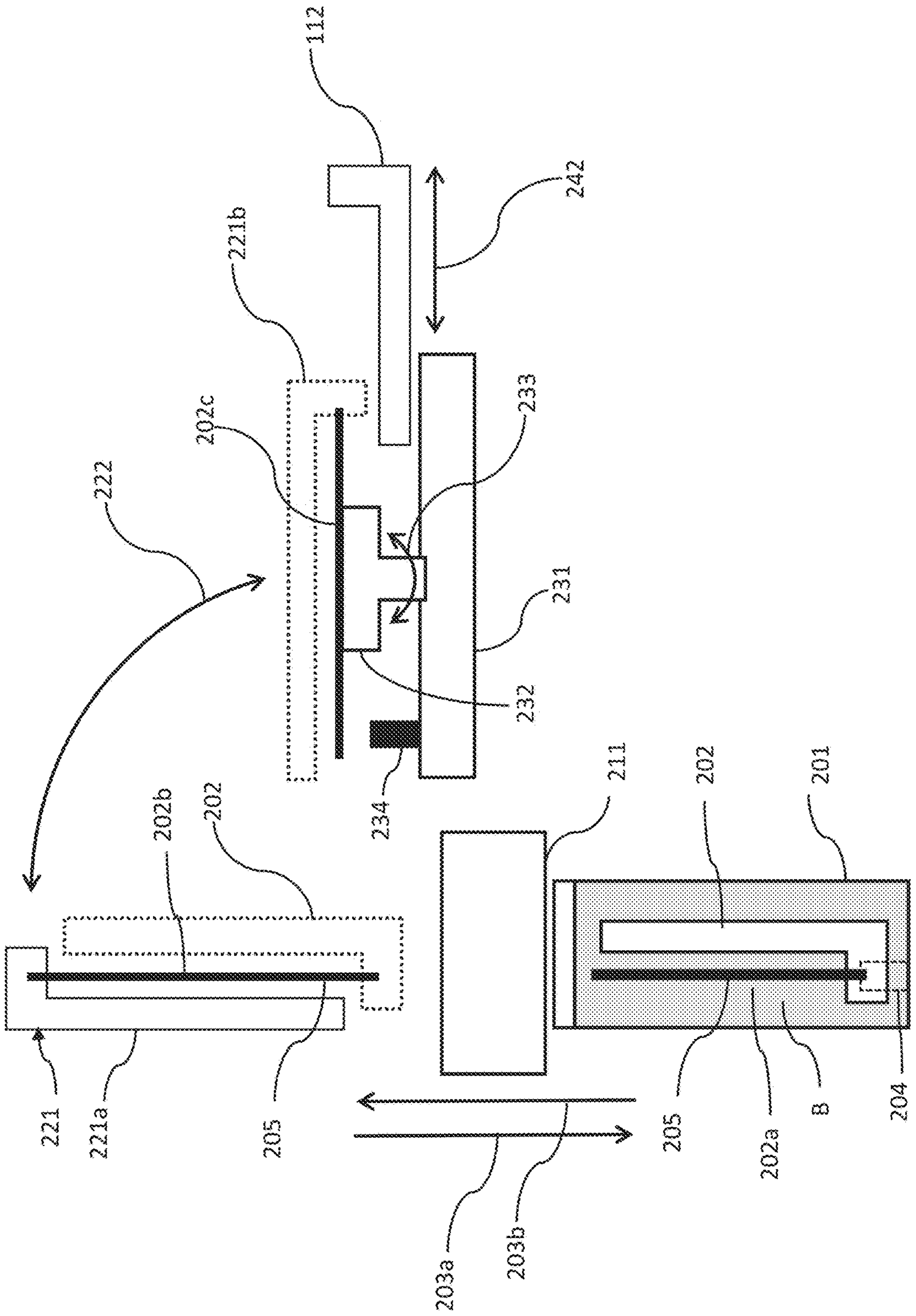
FIG. 2 is a schematic side view of a drying system that includes a drying station and a substrate alignment stage.
Figure 3:
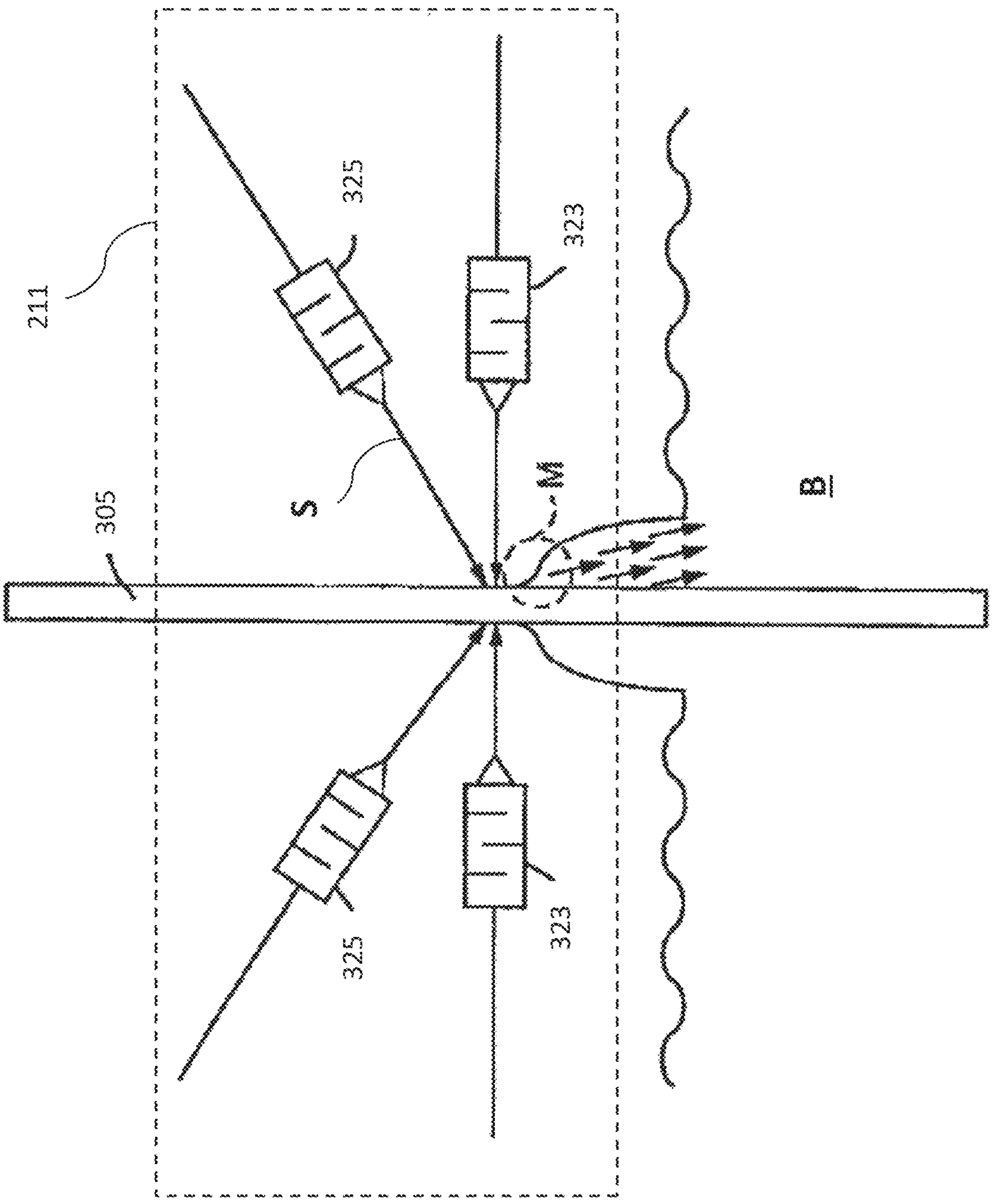
FIG. 3 is a schematic close-up view of a substrate and nozzles positioned within a drier.

As shown in FIG. 2, the drying station 134 includes a tank 201 of liquid (B), e.g, rinsing liquid, and a support 204 that holds a substrate 205 in a substantially vertical orientation, e.g., up to 15° off vertical axis. Either as part of the tank 201 or supported above the tank 201 is a drier 211, e.g., a Marangoni drier. FIG. 3 schematically illustrates the operation of the drier 211 in more detail. In a Marangoni drier a solvent (S) e.g., liquid or vaporous isopropyl alcohol (IPA), that is miscible with the liquid (B) is introduced to a fluid meniscus (M) which forms as the substrate is lifted from the bath or as the bath fluid is drained past the substrate. The solvent is absorbed along the surface of the liquid, with the concentration of the solvent being higher at the tip of the meniscus. The higher concentration of solvent causes surface tension to be lower at the tip of the meniscus than in the bulk of the bath liquid, causing bath liquid to flow from the drying meniscus toward the bulk bath liquid. Such a flow is known as a "Marangoni" flow, and can be employed to achieve substrate drying without leaving streaks, spotting or bath residue on the substrate.

As one example, within the drier 211, a drying vapor supply that has one or more drying vapor nozzles 325 is positioned to flow drying vapor across the entire horizontal diameter of the substrate 305 as the substrate 305 is lifted from the tank 201. The drying vapor can be the solvent, e.g., isopropyl alcohol. The drying vapor nozzles 325 preferably are positioned so that the drying vapor will be absorbed by the rinsing liquid at an air/substrate/rinsing liquid interface, and the interface preferably forms a meniscus (as enclosed by the dashed circle "M" in FIG. 3). Alternatively, the solvent can be supplied in liquid form into the tank 201 to form a liquid film on top of the bath fluid (B). In addition, an optional rinsing liquid supply that has one or more rinsing fluid nozzles 323 can be positioned to spray rinsing liquid across the entire horizontal diameter of the substrate 305 as the substrate 305 is lifted from the tank 201 into the drier 211.

Returning to FIG. 2, substrate 205 is lowered into the tank 201, as shown by arrow 203*a*. The substrate 205 is held in the tank 201 by the support 204 at a first position 202*a*. The substrate 205 can be lowered directly into the tank 201 by the cleaner robot arm so that the substrate 205 is transferred to the support 204 in the tank. Alternatively, the substrate 205 can be placed on the support 204 by the cleaner robot arm while the support 204 is above the tank 201, and the support 204 with the substrate 205 can then be lowered into the tank 201. As still another alternative, the substrate 205 could be handed off above the tank 201 from the cleaner robot arm to a dedicated robot that lowers the substrate onto the support 204 in the tank.

The substrate 205 is raised substantially vertically by a first robot arm 202 from the first position 202*a* in the tank 201 to a second position 202*b*, as shown by the arrow 203*b*. The first robot arm 202 can lift the substrate 205 along an axis that is up to 15° off vertical. In the second position 202*b*, the substrate 205 can be entire removed from the tank 201 (as illustrated in FIG. 2), or the substrate 205 can be only partially out of the tank 201, e.g., about half out of the tank 201. In some implementations, more than half of the substrate is above the liquid level (e.g., from the tank), e.g., 25-40% of the substrate can be submerged in the liquid in the tank or below the position where drying vapor is supplied to the substrate. Similarly, in the second position 202*b*, the substrate 205 can be entirely above the drier 211, or still partially in the drier.

The first robot arm 202 could be provided by the cleaner robot arm 128, i.e., the same robot arm that lowers the substrate 205 into the tank 201. Alternatively, if the support 204 is vertically movable, the first robot arm 202 could be provided by the support 204, i.e., the support 204 lifts the substrate 205 out of the tank 201. As yet another alternative, the substrate 205 could be lowered onto a support 204 (shown in phantom in FIG. 2), e.g., a stationary support, in the tank 201, e.g., by the cleaner robot arm 128, and then a separate robot arm can be used to lift the substrate 205 off the support 204 and out of the tank 201. For example, the first robot arm 202 can be a pusher pin that pushes the substrate from the bottom partially out of the tank 201. Alternatively, the first robot arm 202 can include a notched body to hold and lift from a point at a bottom edge of the substrate, and a two-finger gripper to hold a top edge of the substrate in place.

In the second position 202*b*, the substrate 205 is transferred from the first robot arm 202 to a second robot arm 221, e.g., an output station arm. For example, the second robot arm 221 may pick up the substrate 205 from the first robot arm 202 in a substantially vertical orientation, e.g., up to 15° off vertical axis. While the second robot arm 221 is holding the substrate 205, the first robot arm 202 can be reinserted into the tank or lowered within the tank back to the first position 202*a*.

If the substrate at the hand-off position, i.e., the second position 202*b*, is not completely out of the tank 201 and drier 211, then the second robot arm 221 can lift the substrate 205 substantially vertically until the substrate 205 has cleared the tank 201 and drier 211. From a position in which the substrate 205 has cleared the tank 201 and drier 211, the second robot arm 221 tilts the substrate 205 from a substantially vertical orientation 221*a*, e.g., up to 15° off vertical axis, to a substantially horizontal orientation 221*b*, e.g., up to 15° off horizontal axis, as shown by the arrow 222, and places the substrate 205 onto a rotatable pedestal 232 of an aligner stage 231. The substrate 205 is rested on the rotatable pedestal 232 of the aligner stage 231 in a third position 202*c*, as shown in FIG. 2. The substrate 205 can be coupled to the rotatable pedestal 232 by vacuum suction that can hold the substrate 205 in place during rotation of the pedestal 232. Alternatively, the substrate 205 can be rotated by a substrate edge gripper, or a roller, that can hold the substrate 205 and rotate it to a desired orientation.

The second robot arm 221 can include a notched body to hold and lift from a point at the top edge of the substrate (e.g., at a point between the two fingers of the gripper of the first robot arm 202, and a two-finger gripper to hold a bottom edge of the substrate (e.g., on opposite sides of the notched body of the first robot arm 202). For example, once the substrate 205 is lifted out of the tank 201, the second robot arm 221 grips the substrate 205, the first robot arm 202 releases the substrate 205 and retracts, and then the second robot arm 221 moves the wafer to horizontal orientation.

In some implementations, rather than a separate first robot and second robot, a single robot arm serves both to lift the substrate 205 from the first position 202*a* in the tank 201 to the second position 202*b* out of the tank 201 and above the drier 211, and then rotate the substrate 205 from the second position 202*b* to the substantially horizontal third position 202*c* over the aligner stage 231.

The rotatable pedestal 232 rotates as shown by the arrow 233 while an alignment sensor 234 detects the orientation of the substrate 205. The controller 140 may be used to specify a desired orientation of the substrate 205. Once the alignment process is complete, i.e., the substrate has been rotated to the desired orientation, a factory interface robot 112 picks up the substrate 205 in a substantially horizontal orientation from the rotatable pedestal 232 and transports the substrate 205 out from the drying station 134. The movement of the factory interface robot 112 is shown by the arrow 242. In this way, the alignment system can be integrated as part of the post-CMP drying process as part of the handoff to the factory interface robot. The process of simultaneous drying and alignment of multiple substrates is described in more detail below with reference to FIGS. 4A-4E.

Figure 4A:
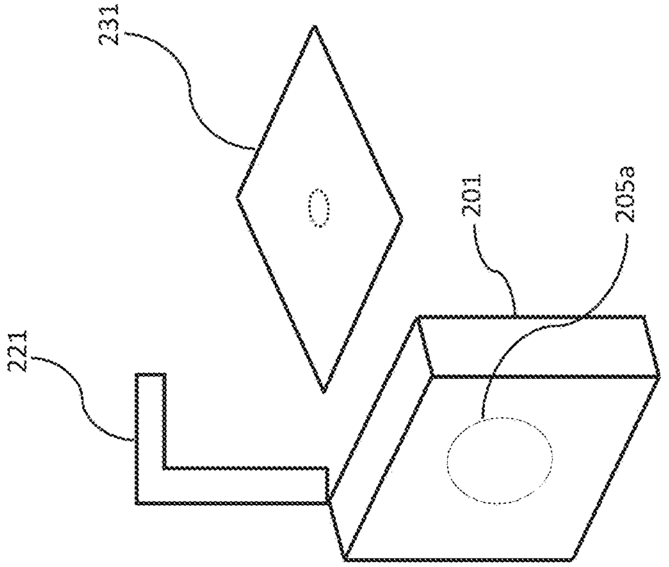
FIG. 4A-4E are schematic perspective views showing operation of a drying system to simultaneously treat one substrate and align another substrate.
Figure 4B:
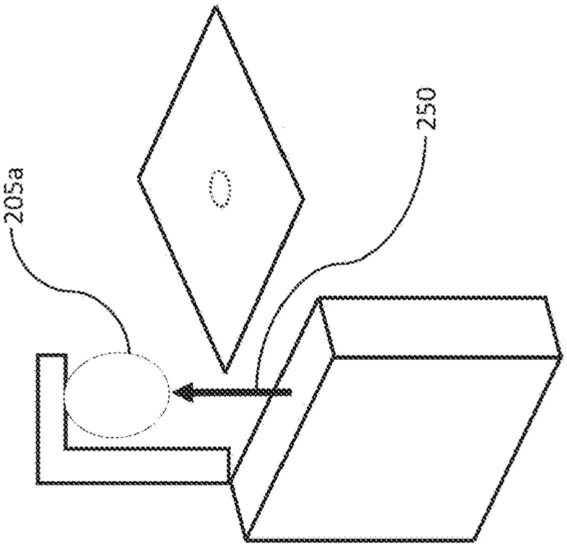
Figure 4C:
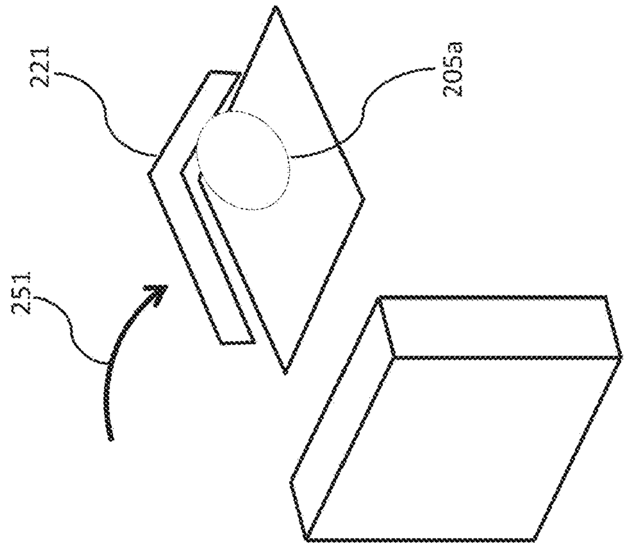
Figure 4E:
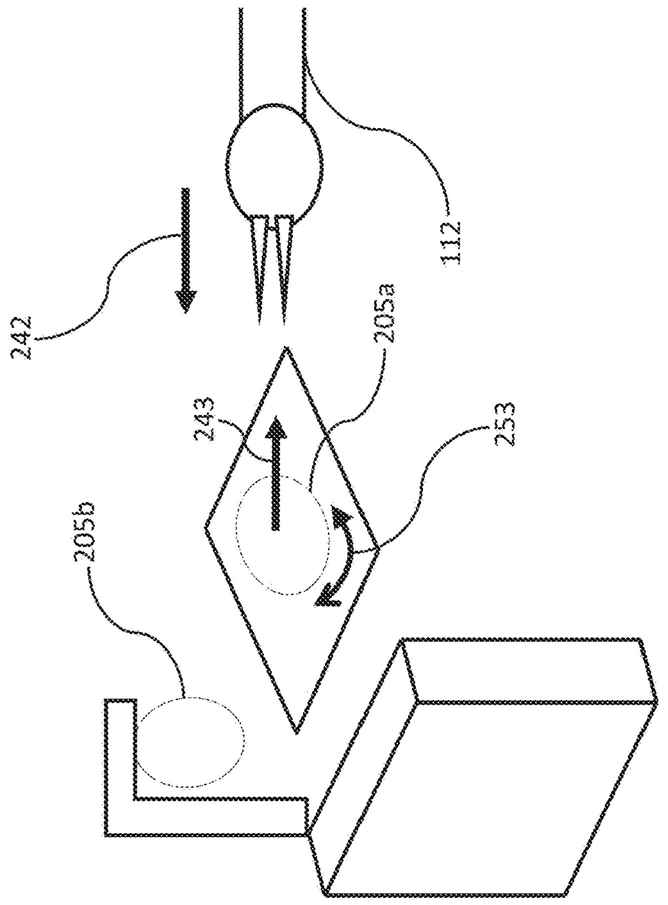

FIG. 4A illustrates a second robot arm 221 (e.g., an output station arm) in a substantially vertical orientation, e.g., up to 15° off vertical axis, an aligner stage 231, and a drier 201 processing a first substrate 205*a*. Since the first substrate 205*a* is positioned in a substantially vertical orientation (e.g., up to 15° off vertical axis) in the drier 201, the drying of the first substrate 205*a* is referred to as a vertical drying process. As illustrated in FIG. 4B, once the drying is complete, the first robot arm 202 moves the first substrate 205*a* vertically partially or entirely out of the tank 201 and drier 211, and the substrate is picked up by the second robot arm 221, in a manner as described above with reference to FIG. 2. Next, if necessary, the second robot arm 221 completes lifting of the substrate out of the tank 201 and drier 211. Then the second robot arm 221 tilts from a substantially vertical orientation to a substantially horizontal orientation, e.g., up to 15° off horizontal axis (as shown by the arrow 251) and places the first substrate 205*a* onto the aligner stage 231, as illustrated in FIG. 4C. At the same time, a second substrate 205*b* (shown in FIG. 4D) can enter the drier 201, in a manner as described above with reference to FIG. 2.

Figure 4D:
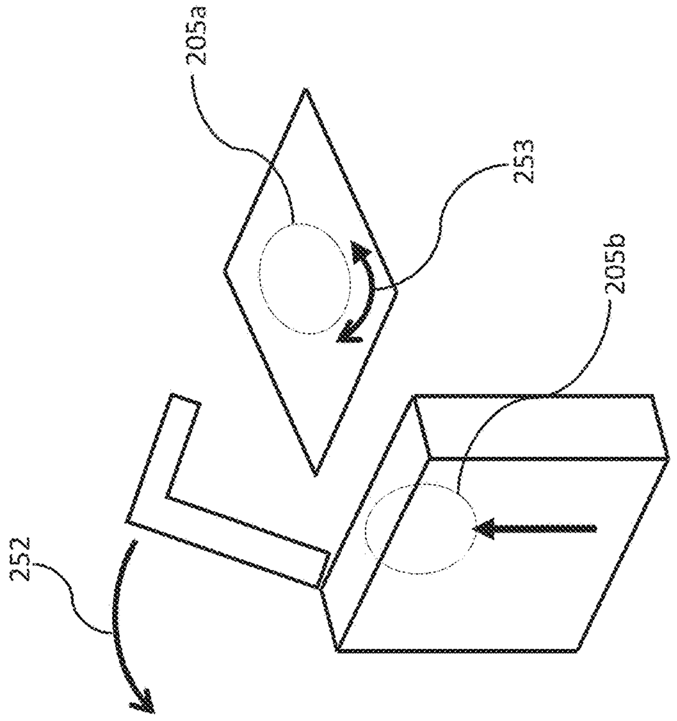

Referring now to FIG. 4D, the aligner stage 231 rotates the first substrate 205*a*, as illustrated by the arrow 253, to a desired orientation. The aligner stage 231 can rotate the substrate 205*a* clockwise or anticlockwise. The rotation can be about an axis perpendicular to the surface of the substrate, and the axis can pass through the center of the substrate. At the same time, the second robot arm 221 tilts back from the horizontal orientation to the vertical orientation (e.g., 15° off vertical axis), as illustrated by the arrow 252, while the second substrate 205*b* is being processed in the drier 201. Next, referring to FIG. 4E, once the alignment process of the first substrate 205*a* is complete, a factory interface robot 112 moves towards the aligner stage 231 as shown by the arrow 242, picks up the first substrate 205*a* from the aligner stage 231 in a substantially horizontal orientation, and moves it out of the drying station in a direction as shown by the arrow 243. At the same time, the second substrate 205*b* moves vertically out of the drier 201 and interfaces with the second robot arm 221, in a manner as described above with reference to FIG. 2.

In this way, multiple substrates can be simultaneously dried and aligned in one drying station resulting in a significant increase in throughput and decreased processing time. Since the drier 201 doesn't need to wait for the factory interface robot to retrieve the first substrate 205*a* before starting to process the second substrate 205*b*, the drier productivity may be increased by as much as 18%. Additionally, the number of moves required to be performed by the factory interface robot 112 per substrate alignment may be decreased such that the factory interface robot 112 is able to maintain its steady state cycle and increase productivity.

In another implementation, the aligner stage 231 may be replaced with a static station for wafer output, such that the substrate 205*a* is picked up directly by the factory interface robot 112 from the static station and moved out for further processing without alignment. With this implementation, the factory interface robot 112 is still decoupled from the drying station critical path, allowing for the same advantages as described above with reference to FIGS. 4A-4E, such as a significant increase in throughput and decrease in processing time.

The controller and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims.

What is claimed is:

1. A substrate drying system for use in a CMP cleaner, the drying system comprising:

a drying station having a drier to dry a wet substrate;

an aligner stage adjacent to the drying station, the aligner stage including a rotatable support to hold a dry substrate dried by the drier in a substantially horizontal position and to rotate the dry substrate about a vertical axis to a desired orientation;

a robot arm including a gripper for holding a single substrate, the arm movable such that the gripper is movable between a first position with a first orientation to hold the substrate in a substantially vertical orientation and a second position with a second orientation to hold the substrate in a substantially horizontal, the first position located above and vertically aligned with the drier to hold the substrate dried by the drier above the drier in a substantially vertical orientation, the second position located above and vertically aligned with the aligner stage to release the dried substrate onto the rotatable support of the aligner stage with the dried substrate in a generally horizontal orientation;

a factory interface robot configured to pick up the dried substrate from the aligner stage in a substantially horizontal orientation and transport the substrate out of the drying station to a cassette; and a controller configured to cause the drier to dry the wet substrate, cause the gripper of the robot arm to grip the dried substrate in the substantially vertical orientation at the first position, cause the robot arm to move the gripper holding the dried substrate from the first position with the first orientation to the second position with the second orientation, cause the gripper to release the dried substrate in the substantially horizontal orientation at the second position onto the rotatable support of the aligner stage, cause the rotatable support of the aligner stage to rotate the dried substrate about the vertical axis to the desired orientation, and cause the factory interface robot to pick up the dried substrate from the aligner stage and transport the substrate out of the drying station to the cassette.

2. The system of claim 1, wherein the drying station is a Marangoni vapor drying stage.

3. The system of claim 1, wherein the gripper includes fingers adjustable to grip edges of the substrate during rotation between the first position and the second position.

4. The system of claim 1, wherein the aligner stage includes a pedestal rotatable about a vertical axis and coupleable to lower surfaces of substrates on the aligner stage, and an alignment sensor for detecting rotational fiducial marks on the substrates.

5. The system of claim 1, wherein the robot arm is movable such that the gripper is movable between a third position inside the drier and the first position above the drier.

6. The system of claim 5, comprising a cleaner robot configured to deliver the substrate into the drier.

7. The system of claim 6, wherein the drying station includes a support and the cleaner robot is configured to place the substrate on the support in the drying station.

8. The system of claim 6, wherein the cleaner robot is configured to hand off the substrate to the gripper of the robot arm in the drier.

9. The system of claim 1, comprising a drying robot to raise the substrate from a third position inside the drier to the first position and to hand-off the substrate to the gripper of the robot arm at the first position.

10. The system of claim 9, wherein the drying robot is configured to raise a first substrate from the third position simultaneously with the aligner stage aligning a second substrate.

11. The system of claim 1, wherein the aligner stage is configured to align a first substrate simultaneously with the drying station drying a second substrate.

12. A method, comprising:

drying a first substrate with a vertical drying process at a drier;

lifting the first substrate substantially vertically out of the drier;

from a position above the drier, tilting the dried first substrate to a horizontal orientation;

before receiving the first substrate with a factory interface robot and after tilting the dried first substrate to the horizontal orientation, aligning the dried first substrate about a vertical axis at an aligner stage while simultaneously drying a second substrate with the vertical drying process, the position vertically aligned with the drier; and after aligning the dried first substrate, transporting the first substrate from the aligner stage to a cassette with the factory interface robot.

13. The method of claim 12, wherein the vertical drying process is a Marangoni drying process.

14. The method of claim 12, wherein the tilting of the dried first substrate includes gripping the dried first substrate in a vertical orientation, rotating the gripped first substrate to the horizontal orientation, and releasing the first substrate onto a stage for the aligning.

15. The method of claim 12, wherein the aligning of the first substrate includes detecting a fiducial mark on the substrate.

16. The method of claim 15, wherein aligning of the first substrate includes stopping the aligning upon the detecting of the fiducial mark.

17. The method of claim 15, wherein aligning of the first substrate comprises further rotating the first substrate by a selected angle upon detecting the fiducial mark and then stopping the rotating at a desired orientation of the first substrate.

* * * * *